(12) United States Patent
Grebenkemper (10) Patent No.: US 6,873,219 B2
(45) Date of Patent: Mar. 29, 2005

(54) PRINTED CIRCUIT BOARD NOISE ATTENUATION USING LOSSY CONDUCTORS

(75) Inventor: John Grebenkemper, Saratoga, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 138 days.

(21) Appl. No.: 10/352,753

(22) Filed: Jan. 28, 2003

(65) Prior Publication Data

US 2004/0145425 A1 Jul. 29, 2004

(51) Int. Cl.$^7$ ............................. H04B 3/28; H05K 9/00
(52) U.S. Cl. ...................... 333/12; 333/81 R; 361/818
(58) Field of Search ................ 333/12, 22 R, 333/81 R; 361/818

(56) References Cited

U.S. PATENT DOCUMENTS

| | | | | |
|---|---|---|---|---|
| 6,104,258 A | * | 8/2000 | Novak | 333/22 R |
| 6,639,155 B1 | * | 10/2003 | Bupp et al. | 174/260 |
| 6,753,481 B2 | * | 6/2004 | Novak | 174/255 |

FOREIGN PATENT DOCUMENTS

| | | |
|---|---|---|
| EP | 0470031 | 2/1992 |
| JP | 11097810 | 4/1999 |

OTHER PUBLICATIONS

J. Grebenkemper, "Thin PCB Laminates Used for power/ground plane pairs, they can reduce high–frequency noise on power distribution networks," Printed Circuit Design Mar. 2002 (4 p.).

I. Novak, "Accuracy Considerations of Power–Ground Plane Models," 8th Topical Meeting on Electrical Performance of Electronic Packaging, Oct. 25–27, 1999, San Diego, CA (4 p.).

B. Eged, "Analytical Calculation Of the Impedance of Lossy Power/Ground Planes," IEEE Instrumentation and Measurement Technology Conference, Budapest, Hungary, May 21–23, 2001 (5 p.).

B. Beker et al., DesignCon 2002, High–Performance System Design Conference, TecForum HP–TF2, Thin PCB Laminates for Power Distribution How Thin is Thin Enough? (106 p.).

PCT Int'l Search Report, PCT/US2004/002434, Aug. 2, 2004 (Mailing Date).

* cited by examiner

Primary Examiner—Robert Pascal
Assistant Examiner—Dean Takaoka (57) ABSTRACT

A method and related configuration for attenuating high-frequency noise that may appear on power planes in printed circuit boards. In one embodiment, the noise attenuation means of the present invention involves applying a lower conductivity material between the conductive and dielectric layers within a printed circuit board. High-frequency noise is then attenuated by the skin effect. In another embodiment, the low conductivity material is applied between the power plane and dielectric layer within the printed circuit board. The low conductivity material may be a material, such as nickel or lead, having an electrical conductivity ranging between about $1 \times 10^4$ mhos/m and $5.8 \times 10^7$ mhos/m for layers having a thickness of about 2 mils.

34 Claims, 9 Drawing Sheets

PRINTED CIRCUIT BOARD NOISE ATTENUATION USING LOSSY CONDUCTORS

BACKGROUND

A wide variety of electrical devices have become part of everyday life. In a typical day, a person may use an alarm clock, a computer, a television, and countless other electrically powered tools and appliances. The electric current used to operate each of these devices produces both electric fields and magnetic fields, collectively referred to herein as electromagnetic fields. As current passes through a conductive material, the conductor acts like an antenna, transmitting electromagnetic fields into the surrounding environment much like a radio transmission antenna. Conversely, when a conductor is placed in an electromagnetic field, current is induced in the conductor, much like a radio reception antenna. Consequently, the electromagnetic fields emitted by one electric device may induce electric current, or electromagnetic interference (EMI), in a different electric device. Also, depending on the frequency of the emissions, EMI is sometimes also referred to as radio frequency interference (RFI).

If the amplitude of the EMI is high enough, it may disrupt normal operations of circuitry. In order to ensure that electrical devices may operate in close proximity to one another, various governing bodies, such as the Federal Communications Commission (FCC) in the United States, impose restrictions on EMI and RFI levels.

Computers often include one or more varieties of printed circuit boards, including motherboards, expansion boards, daughter boards, controller boards, network interface cards, and video adapters. Printed circuit boards (PCBs) are relatively thin, layered substrates upon which integrated circuits and other electronic components are attached. A printed circuit board typically includes a plurality of electrically conductive and insulating layers. Conductive layers generally have conductive paths or traces, isolated from one another by insulating material, and routed within a plane. These traces are generally designed to electrically contact conductive portions of the electronic components mounted on the PCB, forming electrical interconnects. Insulating layers electrically isolate these conductive paths from one another. The principle structure of conductive traces and layers of insulating material may also be used on a smaller scale within a packaged microchip having a PCB-like package substrate.

Switching rates and switching current amplitudes are increasing with each new generation of chip design, contributing to increased switching noise at higher frequencies. Power and ground planes consist of conductive layers connected to a power supply and ground, respectively. Noise on the power and ground planes, and particularly switching noise on power planes, may interfere with operation of the integrated circuits connected to the printed circuit board. If power and ground plane noise is too great, it may cause interference in an integrated circuit that result in faulty operation of an electronic device. These types of errors may be intermittent, and therefore, very difficult to diagnose. These intermittent failures may happen more frequently than users or designers realize. Since they are very difficult to detect, it is generally good engineering design practice to minimize the power and ground plane noise that may cause these failures to begin with.

Existing techniques for noise reduction, including the use of multiple low-inductance bypass capacitors, are becoming increasingly less effective at the higher frequencies used by newer integrated circuits. Bypass capacitors are capacitors that have the feature of filtering noise by "short circuiting" the high frequency components of a signal. Also called decoupling capacitors, bypass capacitors are often connected between each power plane and adjacent ground plane to attenuate noise. Low-frequency bypass capacitors typically have values of tens to thousands of microfarads, and suppress low-frequency noise. High-frequency bypass capacitors generally have smaller values and suppress high-frequency noise, such as undesired EMI. Bypass capacitors also provide a momentary charge to compensate when active devices change their current consumption. The charge in the bypass capacitors is replenished from the power supply that is connected between each power plane and ground.

Several of these high-frequency bypass capacitors are often distributed across a printed circuit board. Bypass capacitors store and release charge, which reduces the amplitude of noise on the printed circuit board power and ground plane pairs. Typically, hundreds or even thousands of bypass capacitors may be used on a printed circuit board, passing through the power and ground planes within the board. Bypass capacitors of either the low-pass or the high-pass type intrude on valuable board space, making the board larger, and generally more expensive, than it otherwise would need to be. Thus, reducing the number of bypass capacitors needed for noise reduction may generate board space and cost savings.

Although dielectrics are a desired component of a printed circuit board for isolating adjacent conductive planes, it has been shown, both experimentally and theoretically, that reducing the thickness of the dielectric layer between a power and a ground plane assists in noise reduction. There are several benefits to keeping space between paired power and ground planes at a minimum. When placed closely together, capacitance between power and ground planes is increased. Also, as high-frequency waves propagate between power and ground planes, the electric field is more intense, inducing a stronger current in the conductive layers. The $I^2R$ loss in the conductors of the current-carrying planes attenuates the higher frequency noise. Due to skin effect, this attenuation becomes greater at higher frequencies.

As transistor densities increase within integrated circuits, the associated EMI and noise restrictions become increasingly difficult to meet. Various cost-added techniques, such as noise filtering, may reduce or attenuate EMI and noise from printed circuit boards. Large copper planes, however, and ground planes in particular, are very difficult to filter effectively, making power and ground planes significant contributors to EMI and noise. Therefore, a need exists for reducing or attenuating EMI emissions and noise from power and ground planes at higher frequencies without significantly increasing the cost of printed circuit boards.

BRIEF SUMMARY

The problems noted above are solved in large part by a low-conductivity laminate, in accordance with the present invention, for attenuating noise within a printed circuit board. Accordingly, the method for attenuating noise on a printed circuit board includes applying a low-conductivity laminate between a conductive layer and a dielectric layer of the printed circuit board, where the laminate is a lossy conductive material with an electrical conductivity less than that of the conductive layer, which may be a power or ground plane.

BRIEF DESCRIPTION OF THE DRAWINGS

For a detailed description of the embodiments of the invention, reference will now be made to the accompanying drawings in which.

NOTATION AND NOMENCLATURE

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The term "plane" is used herein to denote a layer within a printed circuit board, typically comprised of conductive material, and more specifically, relating to either a power or ground plane. It will be understood that the term "plane" may represent traces or patches of material lying in the same plane, and not necessarily a contiguous sheet of material. The term "ground plane" will be used in the present disclosure, although this term is sometimes also referred to as a "negative power plane." The term "dielectric" is used herein to denote a layer of electrically insulating material within a printed circuit board. The term "electrical device" is used herein to represent an electrical apparatus or product including circuitry, printed circuit boards or other electrical components. The term "component" is used herein to represent circuitry elements, such as integrated circuits, resistors, and capacitors, which may be mounted on a printed circuit board. The term "substrate" is used in the context of this application to refer to a package-level assembly solution, and not to a wafer-level material upon which an integrated circuit is fabricated. It will be understood that the term "substrate" includes common board-like package substrates, as well as similar solutions, such as flex tape, upon which an integrated circuit is attached, for mounting to a printed circuit board. To the extent that any term is not specially defined in this specification, the intent is that the term is to be given its plain and ordinary meaning.

DETAILED DESCRIPTION

Figure 1:
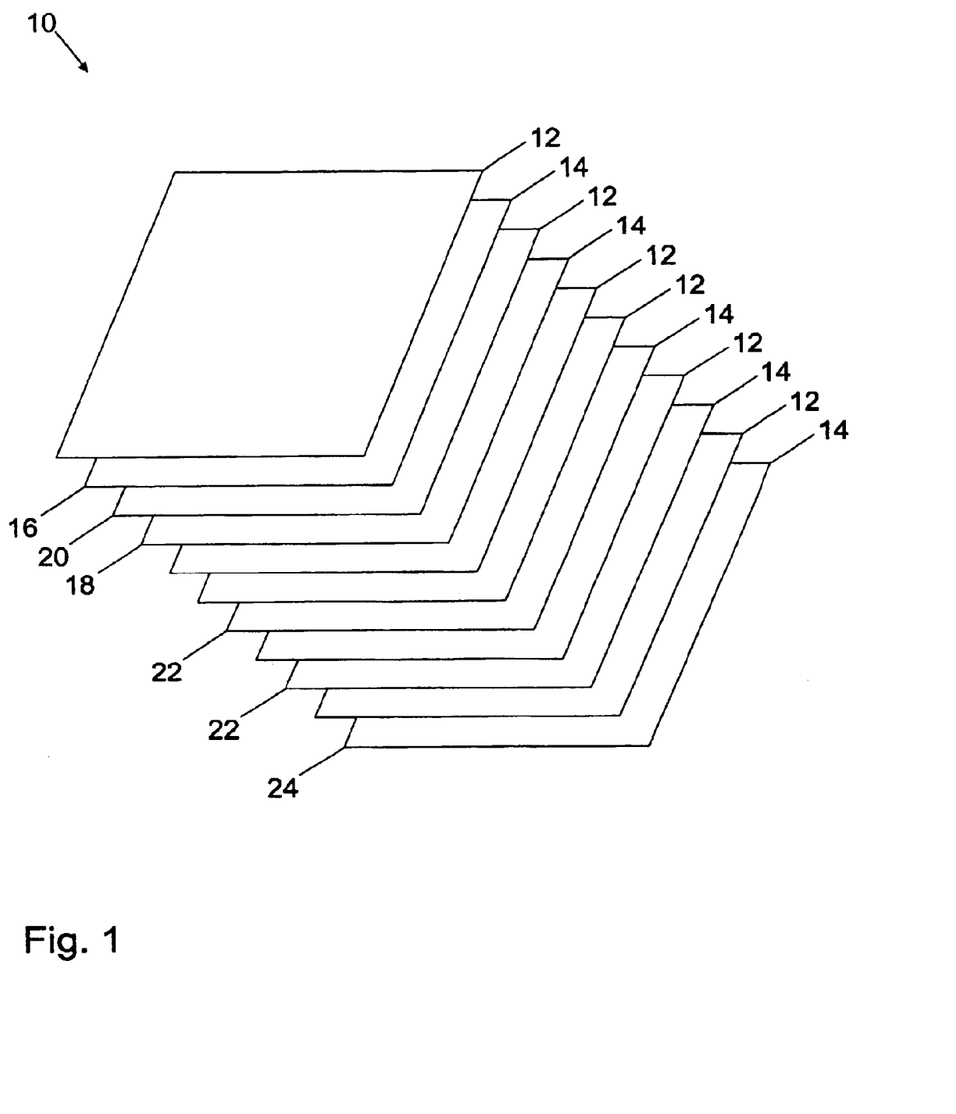
FIG. 1 shows an exploded view of a printed circuit board design.

In accordance with the present invention, a method and related device are disclosed for isolating paired power and ground plane layers from dielectric (or electrically insulating) layers within a printed circuit board (PCB) with thin, lossy laminates, or layers of material relatively low in conductivity when compared to adjacent conductive layers. Referring now to FIG. 1, the present invention may be better understood by understanding a few key aspects of printed circuit boards. To form a printed circuit board 10, insulating layers 12 and conductive layers 14 are laminated together, generally with one or more insulating layers 12 separating each conductive layer 14. Insulating layers 12 are generally made of a ceramic, such as alumina, or other dielectric material, such as FR-4, a glass epoxy resin commonly used in printed circuit board fabrication. Conductive layers 14 are generally made of a metal with a high electrical conductivity, such as copper (Cu) or tungsten (W). One of the conductive layers 14 may then be used as a power plane 16, and another of the conductive layers 14 may be used as a ground plane 18.

It will be understood that, while referenced as "planes," conductive layers generally have the form of conductive paths or traces, routed within a plane. These conductive traces are designed for electrically contacting conductive portions of the electronic components mounted on the PCB, forming electrical interconnects. Insulating layers electrically isolate these conductive traces from one another, so in large part, the conductive plane is not a contiguous layer of conductive material, but a plane in which conductive patches and traces are present and generally isolated from one another. As previously mentioned, the principle structure of conductive traces and layers of insulating material may also be used on a smaller scale within a packaged microchip having a PCB-like package substrate.

Adjacent power planes 16 and ground planes 18, referred to herein as "power and ground plane pairs," are typically separated by an interstitial dielectric layer 20. Additional insulating layers 12 may further be included in the printed circuit board 10 to separate conductive signal layers 22 or I/O pad layers 24. By combining conductive and insulating layers, a multi-layer printed circuit board 10 is constructed. With regards to power distribution noise, it is often desired to place the power plane 16 and ground plane 18 adjacent to one other, separated only by a dielectric layer 20. More complex designs will often contain multiple power and ground plane pairs to distribute the multiple voltages required in today's designs, or to provide a low impedance distribution path for the same voltage. Power planes 16, ground planes 18, signal layers 22, I/O pad layers 24 and other layers made from conductive material are referred to generically as conductive layers 14. Such a printed circuit board is then appropriate for mounting upon it various semiconductor integrated circuits and discrete components.

Designing high-speed digital systems to meet Federal Communications Commission (FCC) requirements for noise, electromagnetic interference (EMI), and radio frequency interference (RFI), is a challenge that starts with the layout of a printed circuit board, also called a printed wiring board (PWB). To avoid multiple design iterations and costly end-product noise or EMI "fixes," the printed circuit board design process has to generate boards that meet both signal integrity and radiated emissions criteria. Today's higher clock frequencies and faster signal rise times often cause traces on printed circuit boards to act like antennas, thereby increasing undesirable EMI and RFI emissions. High speed (e.g., pico-second) edge times also result in high-speed performance problems such as cross talk, ringing, overshoot, undershoot, and ground bounce. Consequently, it has been observed that sound design techniques at the PCB level result in improved signal integrity (e.g., reduced power distribution noise).

As electrical signals carried on printed circuit boards have increased in operating frequency, printed circuit board designers have moved to insulating layers commonly made of a polyimide resin or an epoxy resin (e.g., FR-4). Either of these resins has a comparatively small dielectric constant of between 3.5 and 5. In contrast, previously used alumina ceramics have much higher dielectric constants on the order of about 10.

On modern printed circuit boards, conductive layers may be made of copper or tungsten using a thin-film forming technique. The thin-film technique is typically a vapor phase deposition method, such as evaporation or sputtering. The thin film technique allows minute wiring patterns to be formed in signal layers and I/O pad layers using photolithography methods. Alumina, ceramics and tungsten used in some printed circuit boards may also used in integrated circuit packages, and more specifically, in package substrates. Common organic substrates may use copper for conductive layers, with bismaleimide-triazine (BT) resin or FR-4 insulating layers. Ceramic substrates may alternatively use tungsten for conductive layers, which are then insulated by ceramics. While tungsten has a lower conductivity than copper, its conductivity is still higher than many low-conductivity laminates that may be used to coat it for noise attenuation. Since the conductivities of nickel and tungsten are relatively similar ($1.46 \times 10^7$ mhos/m and $1.82 \times 10^7$ mhos/m, respectively), other lossy conductors having a lower conductivity than nickel may prove suitable for attenuating noise on tungsten. Accordingly, the teachings herein are also applicable for use within similarly constructed integrated circuit packages to reduce noise or EMI within such integrated circuits.

Printed circuit boards may range in size from less than one square inch to several square feet. Especially with large printed circuit boards and with printed circuit boards carrying or having close proximity with very sensitive circuitry, electromagnetic interference is of great concern. Embodiments of the present invention provide for methods of attenuating high-frequency noise generated on printed circuit board power and ground planes. Such noise is becoming a significant issue in the design of high-speed computer systems, and may cause increased transient failures. Thus, the representative embodiments include methods and printed circuit boards designs directed to reducing unwanted EMI noise.

As described with reference to FIG. 1, printed circuit boards 10 typically include conductive power planes 16, ground planes 18, and signal planes 22. Signals may be routed between the power and ground planes through vertically deposited conductive material to form conductive channels called "vias" (not shown). As mentioned previously, to improve noise attenuation, power and ground planes are often placed next to each other, and separated by a dielectric, to form a power and ground plane pair. This layout allows capacitance between the respective paired planes to more effectively attenuate high-frequency noise. On large printed circuit boards using an FR-4 dielectric, the first resonant frequency on the power and ground plane pair may be in the range of 100 MHz to 300 MHz. With a higher dielectric constant material, the first resonant frequency may be lower. Above the first resonance, there may be many additional resonances, each of which may create excess noise on the power and ground planes.

Figure 2:
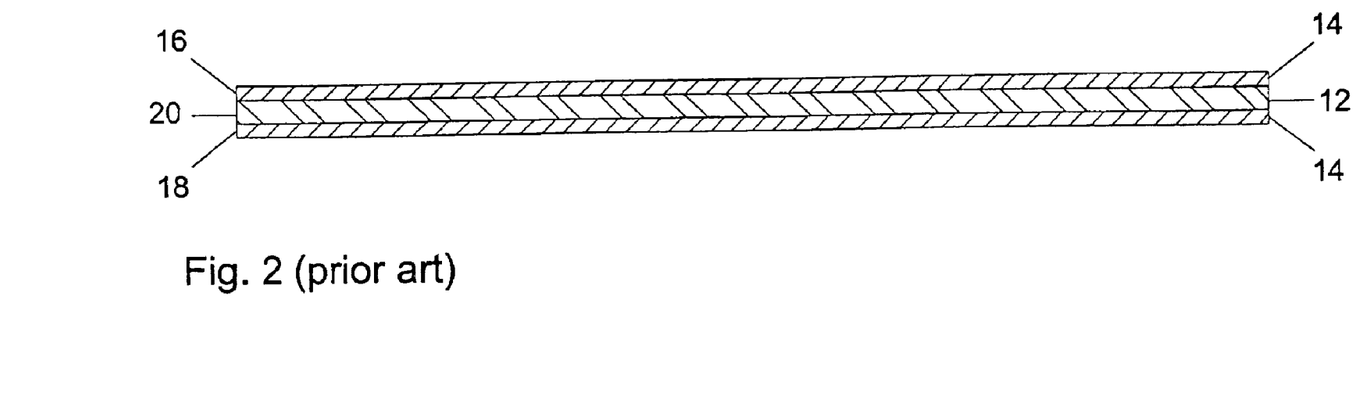
FIG. 2 shows a sectional view of a power and ground plane pair of a printed circuit board design.

Referring now to FIG. 2, a power and ground plane pair configuration is shown within a printed circuit board. As previously mentioned, a power and ground plane pair commonly includes a power plane 16 (a conductive layer 14 connected to a power supply voltage) and a ground plane 18 (a conductive layer 14 connected to ground). A power and ground plane pair generally also includes a dielectric layer 20, or interstitial insulating layer 12, sandwiched between power plane 16 and ground plane 18. A representative configuration of a power and ground plane pair may include a power plane 16 having a thickness of between 0.5 and about three mils (where one mil is $\frac{1}{1000}$ of an inch), a dielectric layer 20 having a thickness of less than about 5 mils, and a ground plane having a thickness of between 0.5 and about three mils. The dielectric layer is all that separates the power and ground planes. In the past, signal traces were also run between power and ground planes, but this configuration was found to generate other issues at high frequencies.

As new generations of chip products move to higher frequencies, the desire for effective noise attenuation becomes a larger issue. In general, existing printed circuit board designs, such as that shown in FIG. 2, do not attenuate high-frequency noise as effectively as desired. As previously mentioned, in practical designs, the use of low-inductance bypass capacitors and smaller spacing between power and ground planes do not reduce noise to the degree desired, whether used alone or in combination.

Noise levels between power and ground planes within a printed circuit board can be measured by probing specially designed boards. This method involves contacting probe points on a board having conductive, channel-like "vias" passing through the board to the specific power and ground layers to be measured. Vias used to probe a specific power or ground plane are generally isolated from all other layers within the board to prevent degradation of the signal.

Figure 3:
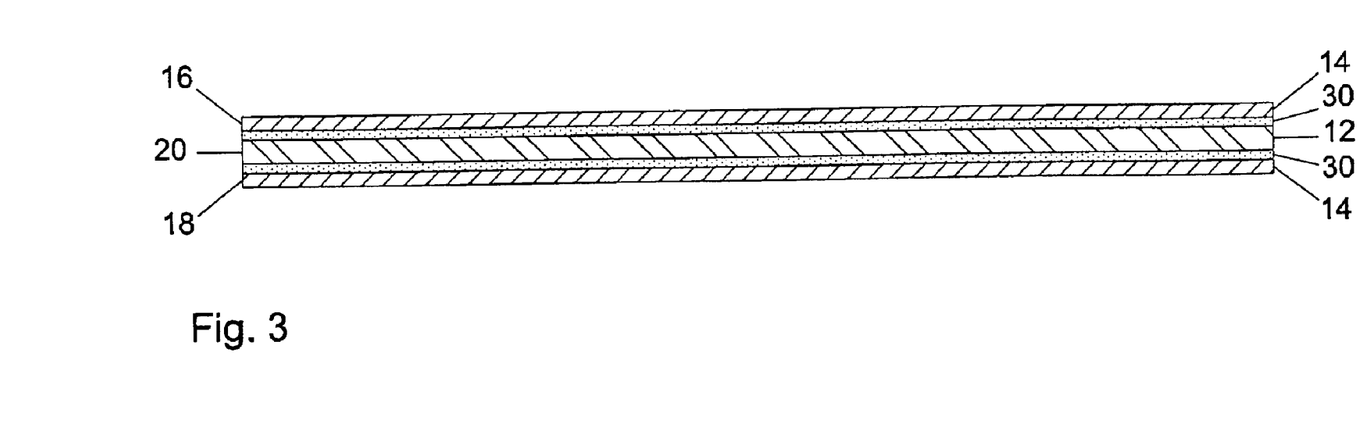
FIG. 3 shows a sectional view of a power and ground plane pair of a printed circuit board with a power and ground plane pair coated with a lossy material in a representative embodiment.

Referring now to FIG. 3, a first embodiment of the present invention is shown. A power and ground plane pair is shown, including a power plane 16, an interstitial dielectric layer 20, and a ground plane 18. In accordance with the first embodiment of the invention, a low-conductivity layer, or laminate 30, is sandwiched between power plane 16 and dielectric 20, as well as between ground plane 18 and dielectric 20. Laminate 30 is a material, such as lead, tin or nickel, with a relatively low electrical conductivity when compared to conductive layers 14. A set of circuit traces (not shown) is often patterned into the conductive layers 14, which contact the surfaces of the adjacent insulating layer 12 in a conventional board design. However, to attenuate noise in accordance with the present invention, a low-conductivity laminate 30 lies between a conductive layer 14 and the adjacent insulating layer 12. This laminate 30 preferably has a conductivity less than that of the conductive layer 14, and most preferably, a conductivity of between about 0.1 percent and about 50 percent of the conductive layer 14.

The preferred range of conductivity values for the laminate 30 may generally lie between about $1 \times 10^4$ mhos/m and $5.8 \times 10^7$ mhos/m (the conductivity of copper) for laminates having a thickness of about 2 mils. The material chosen for laminate 30 is preferably a conductive material having an electrical conductivity low enough, when compared to that of the conductive layer upon which it is applied, that noise is attenuated within a power and ground plane pair. Laminate 30 may therefore be referred to as a "lossy conductor." Low-conductivity materials other than nickel, tin or lead, such as nickel-phosphorus, may produce suitable noise attenuation results in accordance with the present invention, provided they are amenable to printed circuit board manufacturing processes.

The low-conductivity laminate 30 helps to dissipate noise at high frequencies by the skin effect, which teaches that electricity tends to flow in the outermost areas of a conductor. The higher the frequency, the thinner the conduction layer under the conductor surface. Due to the skin effect, the proposed structure will have a higher resistance at high frequencies. This helps dissipate high-frequency energy (in the form of noise) generated by the electrical components on a printed circuit board. At low frequencies, the typically copper or tungsten conductive layers continue to provide a low-resistance power path through the printed circuit board to the integrated circuits and other board-mounted electrical components.

The present invention targets $I^2R$ loss, or resistive loss due to the flow of electric current in the skin of a conductive layer. Resistive loss is equal to the product of the square of the current and the resistance of the conductive material. As a result, if a higher resistance material is plated on the surface of the copper, at higher frequencies, higher $I^2R$ loss may be achieved due to the skin effect, since currents tend to flow on the surfaces of the conductive materials. At lower frequencies, current still basically flows through the conductive layers. Consequently, performance benefits are achieved without causing any significant issues.

A representative construction of a power and ground plane pair in accordance with the present invention may include a power plane 16 having a thickness of between about 0.5 and about 3 mils, a lower conductivity layer 30 (such as nickel or lead) having a thickness of less than about 2 mils, a dielectric layer 20 having a thickness of less than about 5 mils, a lower conductivity layer 30 having a thickness of less than about 2 mils, and a ground plane having a thickness of between about 0.5 and about 3 mils. It will be understood that the layering sequence presented above is preferred, although modifications may be made without departing from the spirit of the invention. Embodiments of the present invention serve to dissipate EMI energy using resistive losses experienced by the current flowing in the conductors that form the power and ground planes. Copper is widely used in conductive layers 14 in a printed circuit board.

The low-conductivity laminate material used in accordance with the present invention preferably has a conductivity less than that of copper ($5.8 \times 10^7$ mhos/m). Potential laminate materials may include, but are not limited to, nickel ($1.5 \times 10^7$ mhos/m), tin ($9 \times 10^6$ mhos/m), lead ($5 \times 10^6$ mhos/m) or a nickel-phosphorus material, sold by Ohmega Technologies, Inc. under the trade name Ohmega-Ply® ($10^5$ mhos/m), used to make buried resistors in printed circuit boards.

Relative layer thickness can be optimized by various modeling or experimental techniques. In general, a thicker low-conductivity layer 30 yields better noise reduction than a thinner layer 30, but there is a limit to thickness. A low-conductivity laminate 30 that is too thick may cause DC current loss, by excessively isolating adjacent power and ground planes. It is generally desired that laminate 30 be thinner than conductive layers 14.

Figure 4:
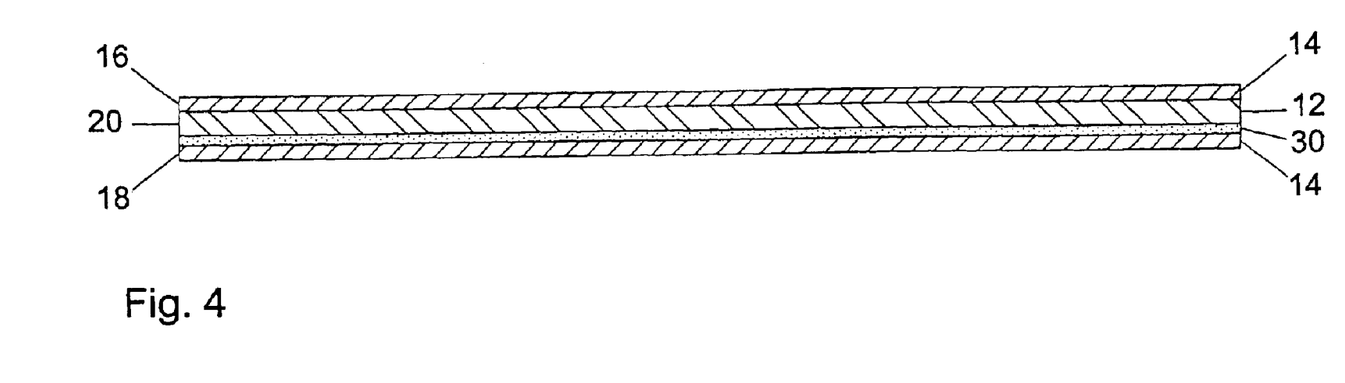
FIG. 4 shows a sectional view of an embodiment of the present invention with a ground plane coated with a lossy material in a representative embodiment.
Figure 5:
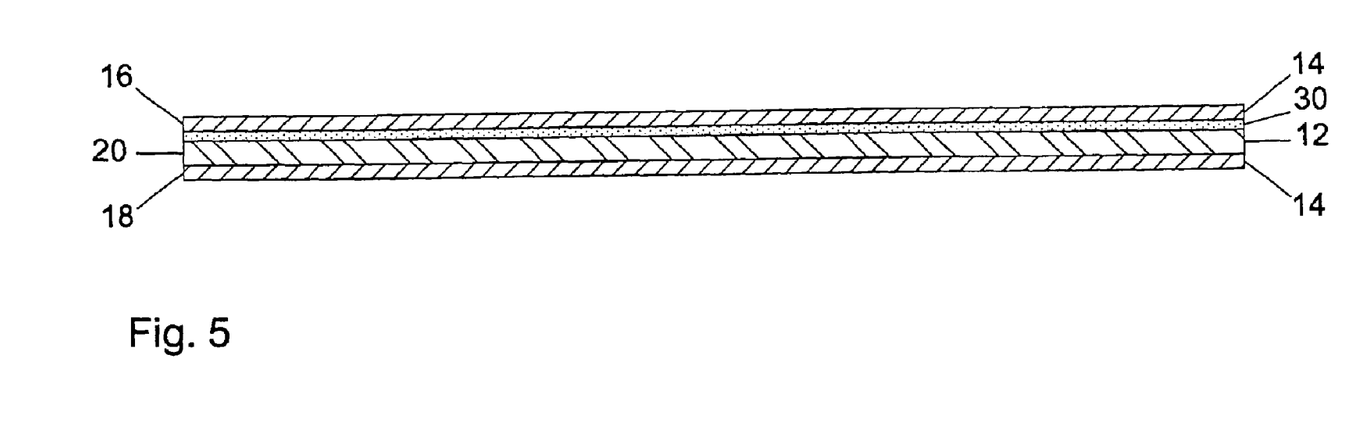
FIG. 5 shows a sectional view of an embodiment of the present invention with a power plane coated with a lossy material in a representative embodiment.

Referring now to FIG. 4, in an alternative embodiment, a section of a printed circuit board is shown having power plane 14 directly contacting dielectric layer 12, while a low-conductivity laminate 30 is sandwiched between dielectric layer 12 and adjacent ground plane 18. Conversely, as shown in FIG. 5, a low-conductivity laminate 30 can be sandwiched between power plane 16 and dielectric 20, which directly contacts ground plane 18. While the embodiments of FIGS. 4 and 5, which have only one low-conductivity laminate 30 per power and ground plane pair, may provide roughly half the noise attenuation as the embodiment of FIG. 3, which uses two laminates 30 per power and ground plane pair, the embodiments of FIGS. 4 and 5 nevertheless provide a degree of noise attenuation, and may be desirable when both targeted noise attenuation and board height are issues.

Computer simulations of a printed circuit board using both lead and nickel laminates of various materials in accordance with the present invention have shown favorable noise-reduction results. One way to reduce noise is to reduce the impedance of a power and ground plane pair. A lower impedance power distribution network will generate less noise for the same switching current. The impedance of a power and ground plane pair varies substantially as a function of frequency due to resonances on a board. At some frequencies, the impedance may be ten times higher than at other frequencies. Resonant impedance peaks highlight particular frequencies at which small switching currents can generate significant amounts of noise.

Referring now to FIGS. 6a–6e, power and ground plane pair impedance is shown as a function of frequency for five different power and ground plane pair types: an uncoated power and ground plane pair, power and ground planes coated with nickel laminate, power and ground planes coated with lead laminate, power and ground planes coated with nickel-phosphorus laminate, and power and ground planes coated with a material having a conductivity of $1 \times 10^4$ mhos/m. The power-ground impedance was computed by taking the root-mean-square (RMS) average over the length and width of the board. For these particular simulations, the boards had a size of 10 by 16 inches with copper thicknesses of 1 mil. In addition, dielectric and laminate thicknesses were also held constant between the simulations.

Figure 6A:
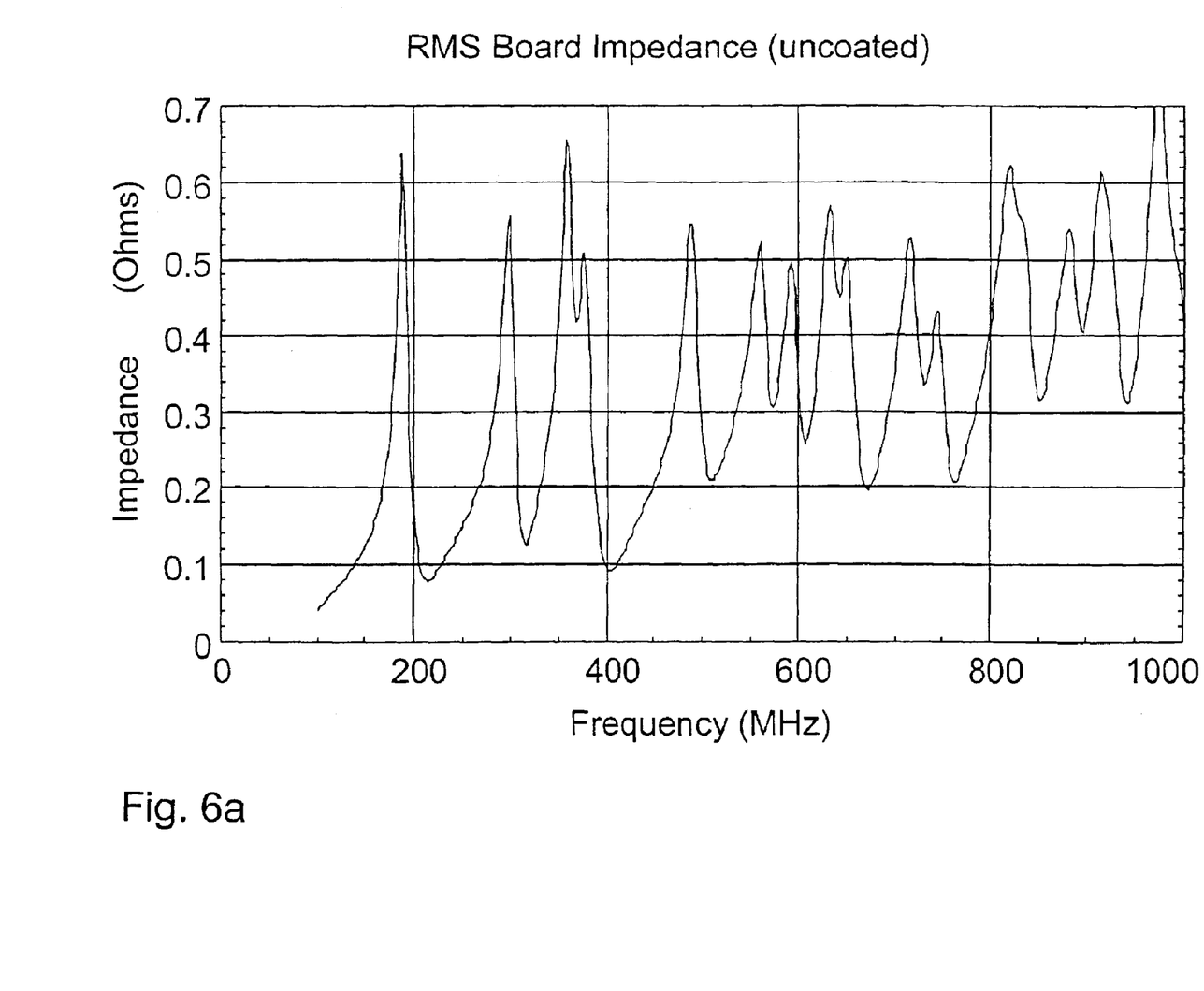
FIG. 6a shows a plot of root-mean-square (RMS) board impedance as a function of frequency for an existing board design including no lossy coating materials in a representative embodiment.
Figure 6B:
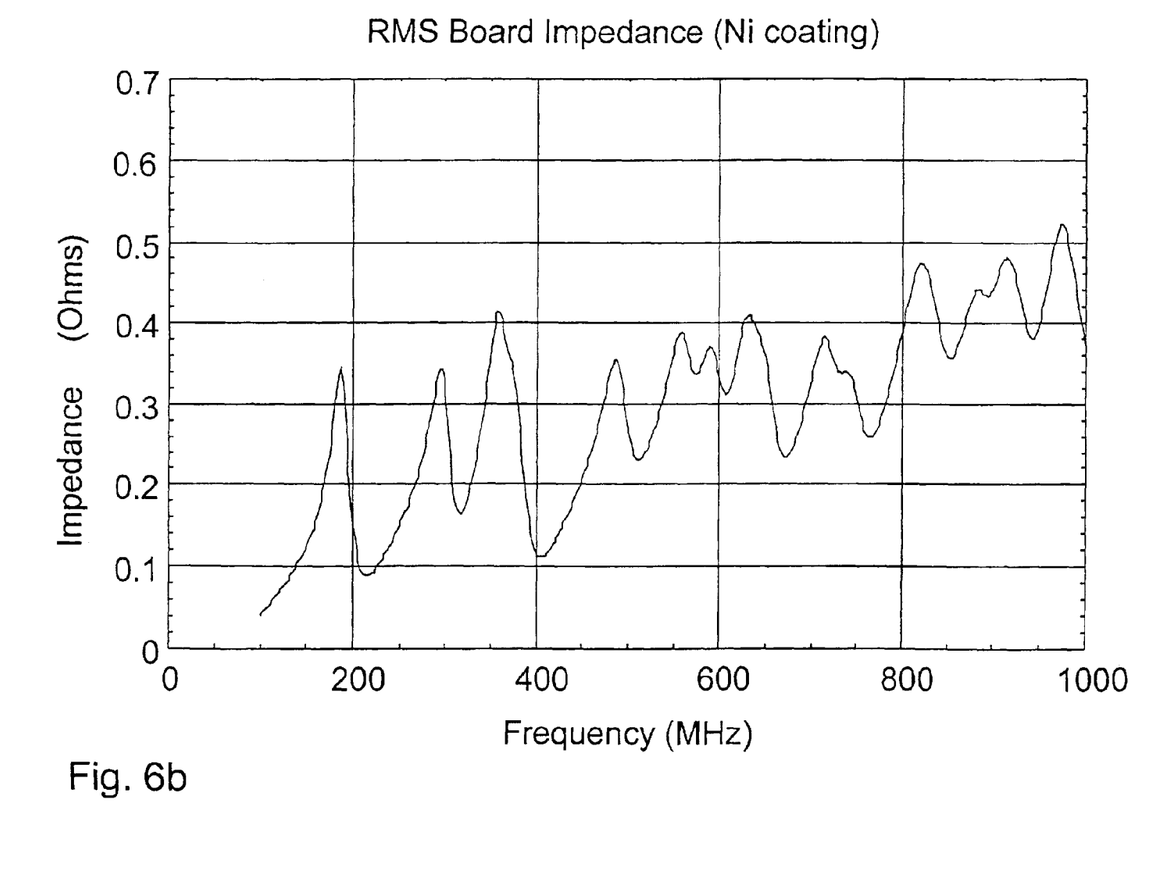
FIG. 6b shows a plot of RMS board impedance as a function of frequency for an existing board design with a power and ground plane pair coated with nickel as a lossy material in a representative embodiment.

Focusing now on FIG. 6a, the uncoated power and ground plane pair, made of copper, had a separation of 4 mils by a material having a relative dielectric constant of 4. In the frequency range of 100 to 400 MHz, the resonant peaks have an amplitude up to about 0.65 ohms, while the dips are about 0.1 ohms. This board design would be more subject to noise, especially at the points near the resonant peaks. The resonant peaks could be reduced in amplitude if the power and ground planes were coated with a material having a lower conductivity. As mentioned previously, at relatively high frequencies, the skin effect forces current to be carried on the surface of the power and ground planes. If this surface has relatively high resistance, it will attenuate the higher frequency waves, reducing the resonant peaks. The low frequency and DC currents necessary to supply power to the chip would still be carried in the conductive layer, so the power loss would not significantly increase using this technique. For instance, copper has a conductivity of $5.8 \times 10^7$ mhos/m. The conductivity of nickel is about $1.5 \times 10^7$ mhos/m. It is expected that this configuration would have lower resonant peaks in the power-ground impedance, which is shown in FIG. 6b. When coated with 100-mil-thick layers of nickel, impedance peaks at just over 0.4 ohms in the 100–400 MHz range, a significant reduction over the uncoated design.

Figure 6C:
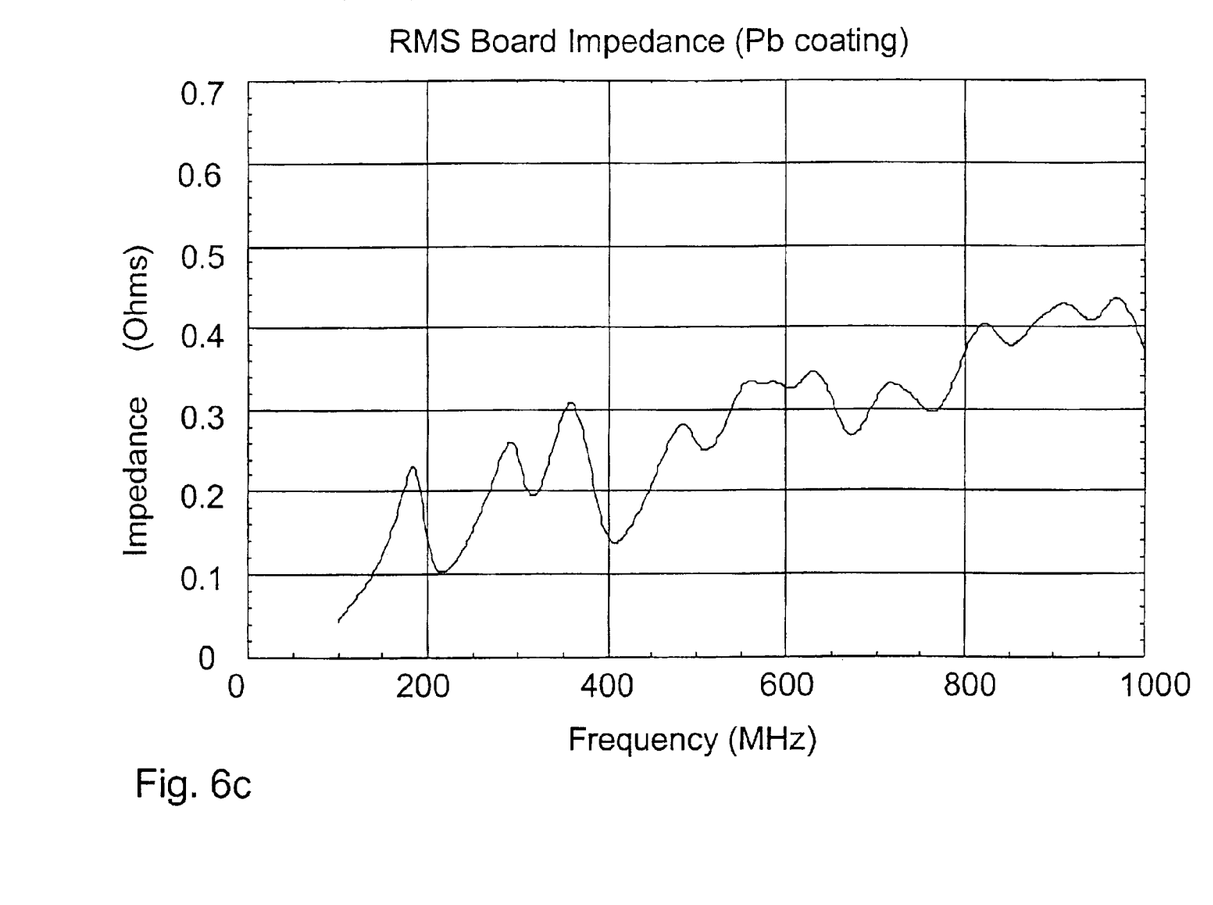
FIG. 6c shows a plot of RMS board impedance as a function of frequency for an existing board design with a power and ground plane pair coated with lead as a lossy material in a representative embodiment.

Lead has an even lower conductivity than nickel, with a conductivity of about 5 mega-mhos/m. If a 100-mil-thick layer of lead is applied to the copper power and ground planes, the resonant peaks can be reduced even further. As shown in FIG. 6c, coating power and ground planes with lead can reduce peak impedance to just over 0.3 ohms in 100–400 MHz range. Although nickel and lead are two common higher resistivity materials, several others may be suitable.

Figure 6D:
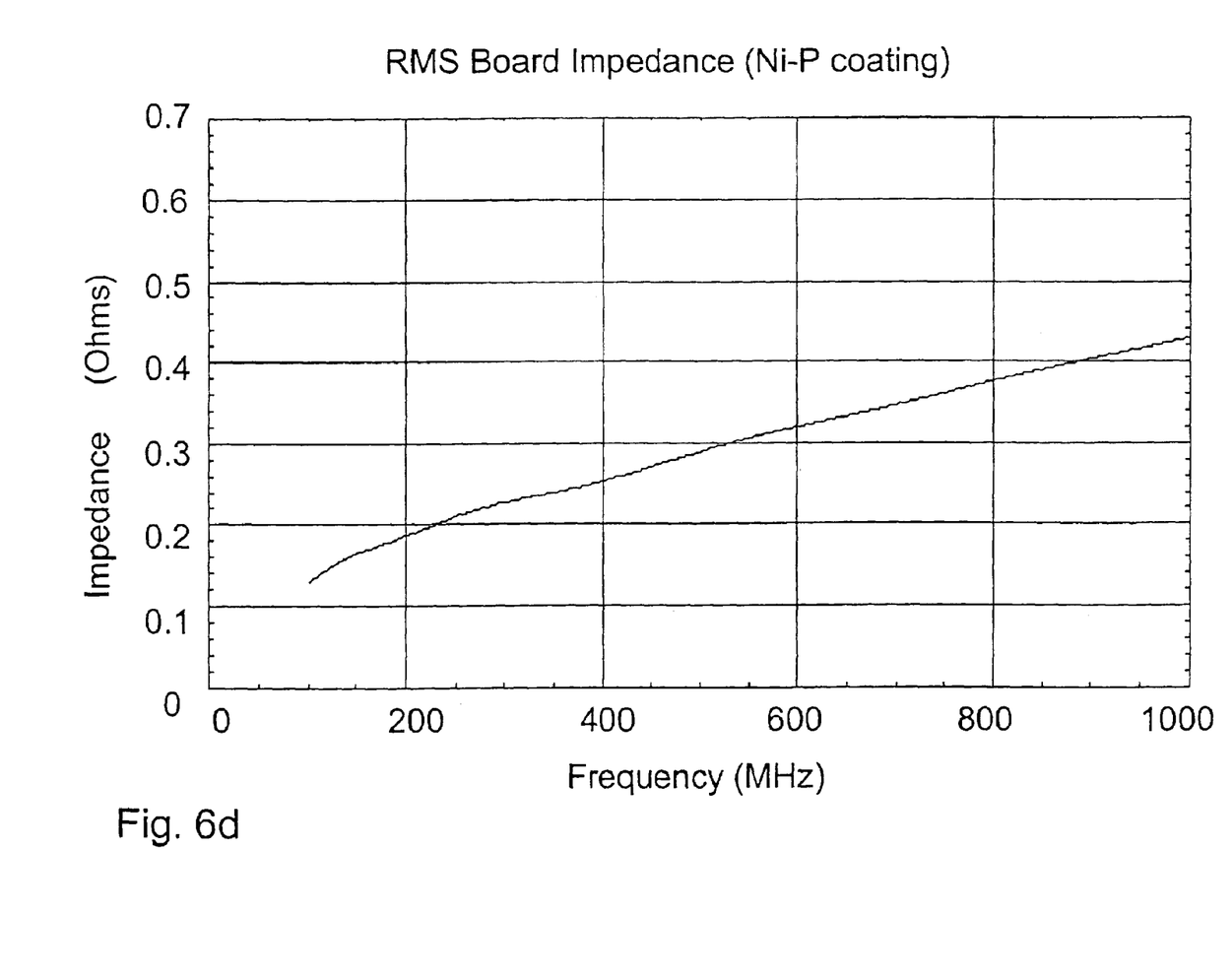
FIG. 6d shows a plot of RMS board impedance as a function of frequency for an existing board design with a power and ground plane pair coated with nickel-phosphorus as a lossy material in a representative embodiment.

Power and ground planes may also be coated with a nickel-phosphorous material used to make buried resistors on printed circuit boards. This material, sold under the trade name Ohmega-Ply®, is compatible with existing printed circuit board processing technology and has a conductivity of about $1 \times 10^5$ mhos/m. If a sufficiently thick layer could be used on the power and ground planes of a printed circuit board, the resonant peaks would essentially disappear. Referring now to FIG. 6d, resonant peaks are virtually nonexistent when using a 100-mil-thick layer of nickel-phosphorus to coat power and ground planes. In the frequency range of 100–400 MHz, impedance is less than 0.25 ohms.

Figure 6E:
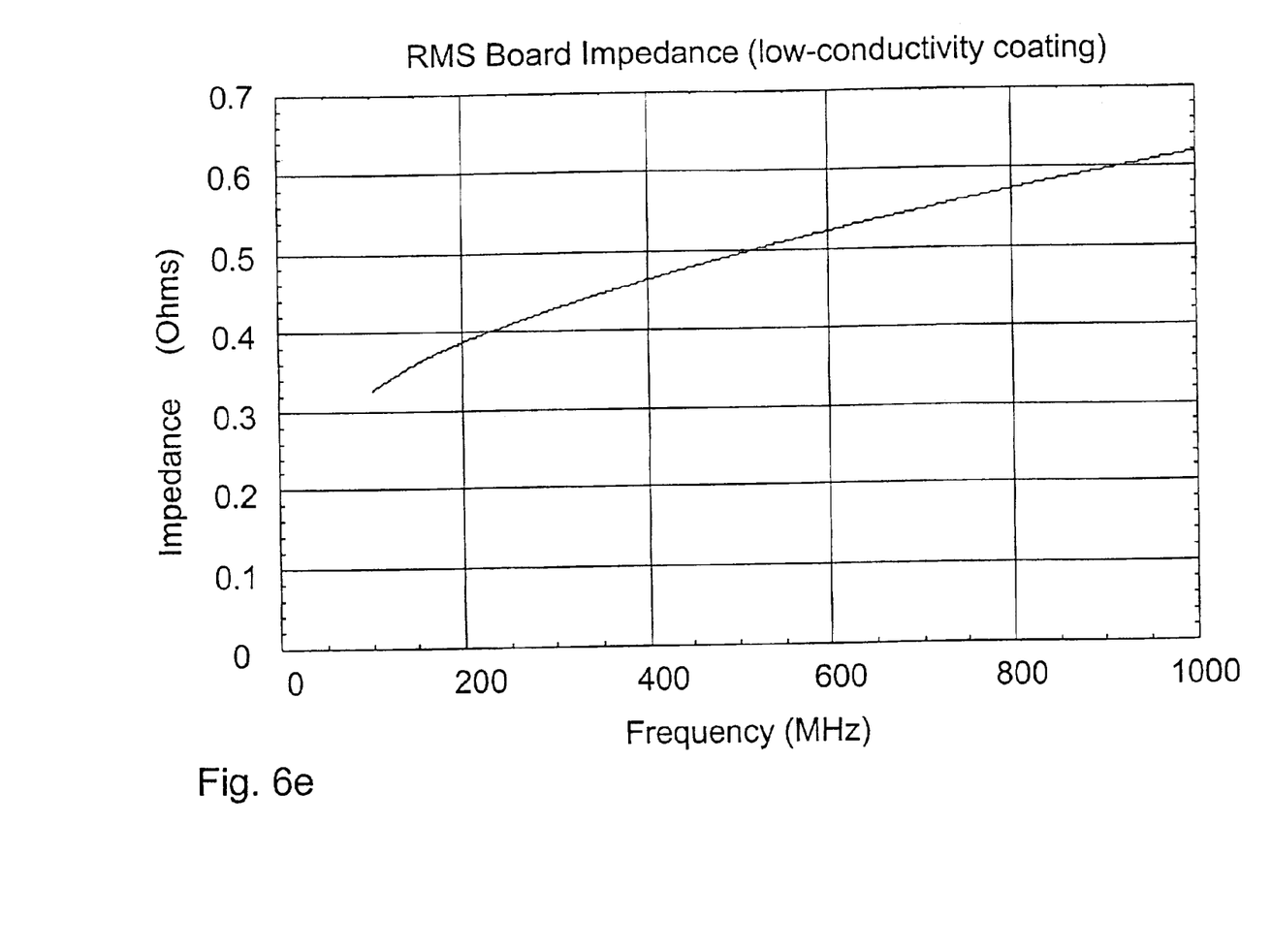
FIG. 6e shows a plot of RMS board impedance as a function of frequency for an existing board design with a power and ground plane pair coated with a lossy material having a conductivity of $1 \times 10^4$ mhos/m in a representative embodiment.

However, there may be a limit to how far this technology can be extended. Simulating a material with a conductivity of $1 \times 10^4$ mhos/m, the impedance plat as shown in FIG. 6e shows a relatively peak-free plat, but with higher impedance values overall. The surface resistance of the material contributes to the overall rise in the impedance curve. This simulation was performed assuming a 100-mil-thick material was applied to the copper layer, so a thinner material may show some benefit. It will be understood that, while a 100-mil-thick low-conductivity coating is probably not practical for conventional printed circuit boards, this exaggerated thickness used in simulations demonstrates the effect a relatively thick laminate has on noise reduction.

Selecting the thickness of the lower conductivity laminate depends on several factors. In standard printed circuit boards, the copper layers are typically in the range of 0.5 to 2 mils thick. Preferably, the thickness of the low conductivity surface layer should not be significantly thicker than the copper layer, or the overall thickness of the printed circuit board would be increased. The maximum thickness of the coating material should preferably be less than 10 mils, and more preferably, less than 2 mils. If only one of the conductive layers of a power and ground plane pair is coated, the laminate thickness may further vary.

Figure 7:
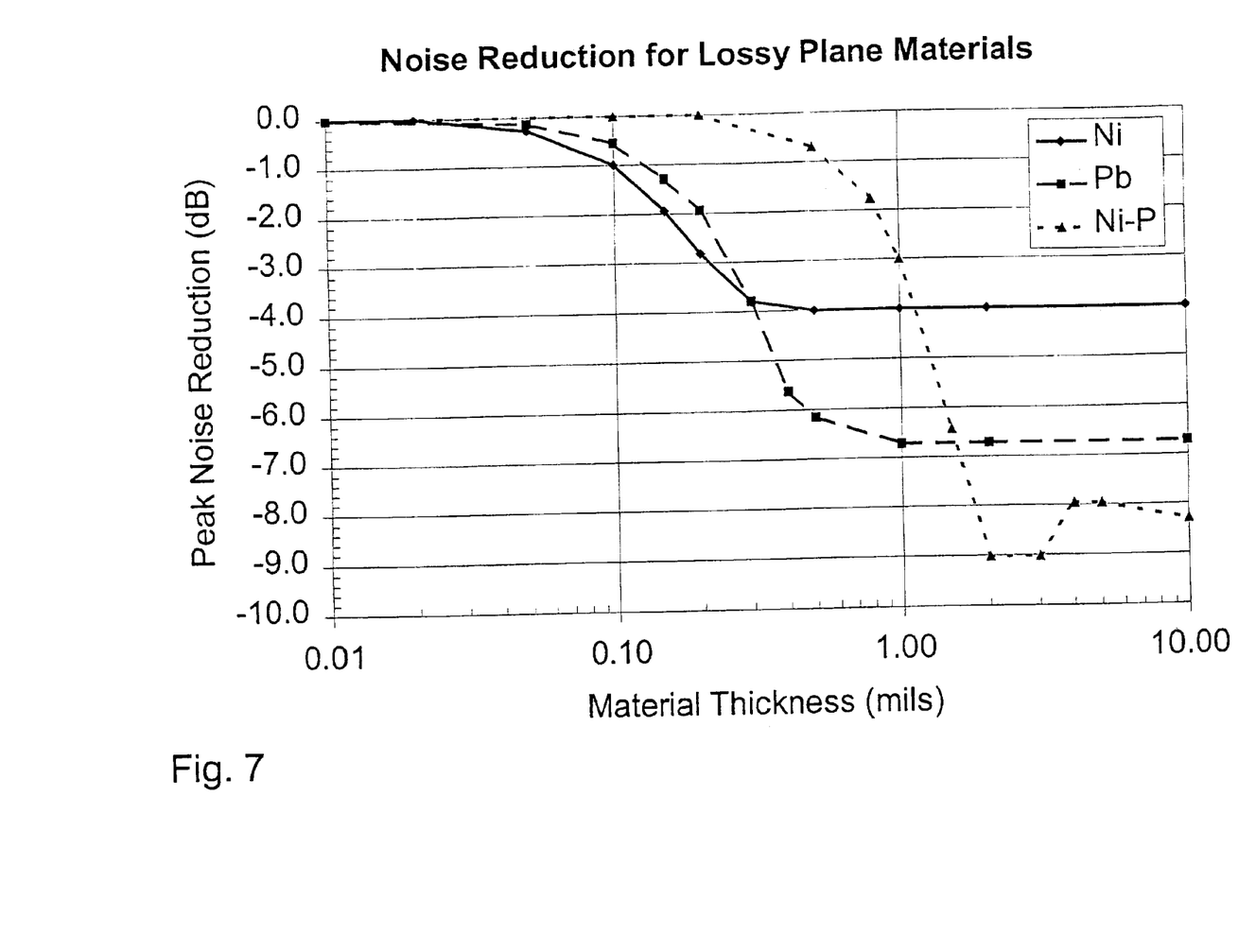
FIG. 7 shows a plot of peak noise reduction as a function of lossy coating material thickness for nickel, lead and nickel-phosphorus in accordance with a representative embodiment.

FIG. 7 shows a plot of peak noise reduction as a function of material thickness for nickel, lead and nickel-phosphorus. The simulation was done in the frequency range of 100 to 400 MHz, since this range generates much of the high-frequency noise found on power and ground planes. The nickel coating of the copper only shows a 4.0 decibel (dB) reduction in noise, but it is fully effective at 0.5 mil thickness. The lower conductivity lead coating can provide a 6.7 dB noise reduction, but can require a 1-mil-thick layer for effectiveness. The nickel-phosphorous material is most effective, with a 9.0 dB noise reduction, but requires a 2-mil-thick layer for full effectiveness. The noise attenuation method of the present invention can reduce noise on printed circuit board power and ground plane layers, but may require noise analysis to determine the optimal material and thickness to achieve the desired noise reduction.

The noise attenuation method of the present invention may be used alone, or in combination with other existing noise attenuation measures for greater effect. Bypass capacitors may be manufactured into printed circuit boards having the noise attenuation method of the present invention. Numerous variations and modifications will become apparent to those skilled in the art once the above disclosure is fully appreciated.

What is claimed is:

1. A method for attenuating noise on a printed circuit board comprising:
   applying a laminate between a conductive layer and a dielectric layer of the printed circuit board, wherein the laminate is a lossy conductor with an electrical conductivity less than that of the conductive layer, and wherein the laminate is globally applied across the conductive and dielectric layers wherein the laminate has an electrical conductivity between about $1 \times 10^4$ mhos/meter and about $5.8 \times 10^7$ mhos/meter.

2. The method of claim 1 wherein the conductive layer is a plane in a set consisting of a power plane and a ground plane.

3. The method of claim 1 wherein two adjacent conductive layers comprise a power and ground plane pair, the conductive layers separated by a dielectric layer, wherein a laminate is sandwiched between the dielectric and at least one of the conductive layers.

4. The method of claim 1 wherein the laminate includes a material in a set consisting of lead, phosphorus and tin.

5. The method of claim 1 wherein the laminate has a thickness equal to or less than that of the conductive layer.

6. A method for attenuating noise on a printed circuit board comprising:
   applying a laminate between a conductive layer and a dielectric layer of the printed circuit board, wherein the laminate is a lossy conductor with an electrical conductivity less than that of the conductive layer, wherein the laminate has an electrical conductivity between about $1 \times 10^4$ mhos/meter and about $5.8 \times 10^7$ mhos/meter.

7. A method for attenuating noise on a printed circuit board comprising:
   applying a laminate between a conductive layer and a dielectric layer of the printed circuit board, wherein the laminate is a lossy conductor with an electrical conductivity less than that of the conductive layer wherein the laminate has a maximum thickness of about 2 mils wherein the laminate has an electrical conductivity between about $1 \times 10^4$ mhos/meter and about $5.8 \times 10^7$ mhos/meter.

8. A printed circuit board comprising:
   a conductive layer;
   a dielectric layer;
   a laminate located between the conductive layer and the dielectric layer, wherein the laminate material is a lossy conductor with an electrical conductivity less than that of the conductive layer, and wherein the laminate is globally applied across the conductive and dielectric layers wherein the laminate has an electrical conductivity between about $1 \times 10^4$ mhos/meter and about $5.8 \times 10^7$ mhos/meter.

9. The printed circuit board of claim 8 wherein the conductive layer is a plane in a set consisting of a power plane and a ground plane.

10. The printed circuit board of claim 8 wherein the laminate includes a material in a set consisting of lead, phosphorus and tin.

11. The printed circuit board of claim 8 wherein the laminate has a thickness equal to or less than that of the conductive layer.

12. A printed circuit board comprising:
a conductive layer;
a dielectric layer;
a laminate located between the conductive layer and the dielectric layer, wherein the laminate material is a lossy conductor with an electrical conductivity less than that of the conductive layer, wherein the laminate has an electrical conductivity between about $1 \times 10^4$ mhos/meter and about $5.8 \times 10^7$ mhos/meter.

13. An EMI-reducing circuit board structure that comprises:
a dielectric layer having a first surface;
circuit traces patterned on said first surface, wherein the circuit traces each include:
a first layer of conductive material; and
a second layer of low-conductivity material that contacts the first layer, wherein the low-conductivity material has a conductivity between about 0.1% and 50% of the conductive material.

14. A packaging substrate for integrated circuits comprising:
a conductive layer;
a dielectric layer;
a laminate located between the conductive layer and the dielectric layer, wherein the laminate material is a lossy conductor with an electrical conductivity less than that of the conductive layer, and wherein the laminate is globally applied across the conductive and dielectric layers wherein the laminate has an electrical conductivity between about $1 \times 10^4$ mhos/meter and about $5.8 \times 10^7$ mhos/meter.

15. The packaging substrate of claim 14 wherein the conductive layer is a plane in a set consisting of a power plane and a ground plane.

16. The packaging substrate of claim 14 wherein the laminate is a material in a set consisting of lead, phosphorus and tin.

17. The packaging substrate of claim 14 wherein the laminate has a thickness equal to or less than that of the conductive layer.

18. A packaging substrate for integrated circuits comprising:
a conductive layer;
a dielectric layer;
a laminate located between the conductive layer and the dielectric layer, wherein the laminate material is a lossy conductor with an electrical conductivity less than that of the conductive layer, wherein the laminate has an electrical conductivity between about $1 \times 10^4$ mhos/meter and about $5.8 \times 10^7$ mhos/meter.

19. An apparatus for connecting electrical devices, comprising:
a conductor layer;
a laminate layer globally disposed about the conductor layer; and
an insulator layer globally disposed about the laminate layer, wherein the electrical conductivity of the laminate layer is less than the conductivity of the insulator layer, wherein the laminate layer comprises phosphorus.

20. A semiconductor package for integrated circuits comprising:
a substrate for electrically interconnecting with an integrated circuit, the substrate comprising at least one conductive layer and at least one dielectric layer, wherein a laminate is globally distributed between the conductive layer and the dielectric layer, and wherein the laminate material is a lossy conductor with an electrical conductivity less than that of the conductive layer wherein the laminate has an electrical conductivity between about $1 \times 10^4$ mhos/meter and about $5.8 \times 10^7$ mhos/meter.

21. The semiconductor package of claim 20 wherein the conductive layer is a plane in a set consisting of a power plane and a ground plane.

22. The semiconductor package of claim 20 wherein the laminate includes a material in a set consisting of lead, phosphorus and tin.

23. The semiconductor package of claim 20 wherein the laminate has a thickness equal to or less than that of the conductive layer.

24. A semiconductor package for integrated circuits comprising:
a substrate for electrically interconnecting with an integrated circuit, the substrate comprising at least one conductive layer and at least one dielectric layer, wherein a laminate is sandwiched between the conductive layer and the dielectric layer, wherein the laminate material is a lossy conductor with an electrical conductivity less than that of the conductive layer, and wherein the laminate has an electrical conductivity between about $1 \times 10^4$ mhos/meter and about $5.8 \times 10^7$ mhos/meter.

25. An apparatus for connecting electrical devices, comprising:
a conductor layer;
a laminate layer globally disposed about the conductor layer; and
an insulator layer globally disposed about the laminate layer, wherein the
electrical conductivity of the laminate layer is less than the conductivity of the insulator layer, wherein the laminate layer has a conductivity between about 0.1% and 50% of the conductor layer.

26. An EMI-reducing circuit board structure that comprises:
an dielectric layer having a first surface;
circuit traces patterned on said first surface, wherein the circuit traces each include:
a first layer of conductive material; and
a second layer of low-conductivity material that globally contacts the first layer wherein the second layer has an electrical conductivity between about $1 \times 10^4$ mhos/meter and about $5.8 \times 10^7$ mhos/meter.

27. The structure of claim 26, wherein the second layer lies between the first layer and the dielectric layer.

28. The structure of claim 26, wherein the low-conductivity material has a conductivity less than that of the conductive material.

29. The structure of claim 26, further comprising:
a second set of circuit traces patterned on a second surface of the dielectric layer opposite the first surface.

30. The structure of claim 29, wherein the second set of circuit traces includes:
a first layer of conductive material; and a second layer of low-conductivity material that contacts the first layer.

31. The structure of claim 30, wherein the layer of low-conductivity material in the second set of circuit traces lies between the dielectric layer and the layer of conductive material in the second set of circuit traces.

32. An apparatus for connecting electrical devices, comprising:

a conductor layer;

a laminate layer globally disposed about the conductor layer; and an insulator layer globally disposed about the laminate layer, wherein the electrical conductivity of the laminate layer is less than the conductivity of the conductor layer but greater than the conductivity of the insulator layer wherein the laminate has an electrical conductivity between about $1 \times 10^4$ mhos/meter and about $5.8 \times 10^7$ mhos/meter.

33. The apparatus of claim 32, wherein the laminate layer comprises lead.

34. The apparatus of claim 32, wherein the laminate layer comprises tin.

* * * * *